United States Patent
Shiraki et al.

(10) Patent No.: US 8,623,769 B2
(45) Date of Patent: Jan. 7, 2014

(54) THROUGH HOLE FORMING METHOD, NOZZLE PLATE AND MEMS DEVICE

(75) Inventors: Miho Shiraki, Hokuto (JP); Junichi Takeuchi, Chino (JP)

(73) Assignee: Seiko Epson Corporation (JP)

( * ) Notice: Subject to any disclaimer, the term of this patent is extended or adjusted under 35 U.S.C. 154(b) by 63 days.

(21) Appl. No.: 13/409,604

(22) Filed: Mar. 1, 2012

(65) Prior Publication Data

US 2012/0223615 A1 Sep. 6, 2012

(30) Foreign Application Priority Data

Mar. 2, 2011 (JP) ................... 2011-044778

(51) Int. Cl.
*H01L 21/301* (2006.01)
*H01L 21/302* (2006.01)
*F15D 1/08* (2006.01)

(52) U.S. Cl.
USPC ........... 438/700; 257/E21.215; 216/2; 347/47

(58) Field of Classification Search
None
See application file for complete search history.

(56) References Cited

U.S. PATENT DOCUMENTS

| | | | | |
|---|---|---|---|---|
| 6,143,190 A | * | 11/2000 | Yagi et al. | 216/27 |
| 2009/0256891 A1 | * | 10/2009 | Anderson et al. | 347/61 |
| 2010/0220148 A1 | * | 9/2010 | Menzel et al. | 347/47 |
| 2010/0253743 A1 | * | 10/2010 | Takeuchi | 347/47 |

FOREIGN PATENT DOCUMENTS

| | | |
|---|---|---|
| JP | 2007-168344 | 7/2007 |
| JP | 2008-198642 | 8/2008 |
| JP | 2008-265007 | 11/2008 |
| JP | 2008-273079 | 11/2008 |
| JP | 2008-279707 | 11/2008 |
| JP | 2009-012328 | 1/2009 |
| JP | 2009-148924 | 7/2009 |
| JP | 2010-115892 | 5/2010 |
| JP | 2010-186971 | 8/2010 |
| JP | 2010-240852 | 10/2010 |

* cited by examiner

*Primary Examiner* — Thomas L Dickey
*Assistant Examiner* — Joseph Schoenholtz
(74) *Attorney, Agent, or Firm* — Harness, Dickey & Pierce, P.L.C.

(57) ABSTRACT

A through hole forming method includes forming a plurality of small holes in a first substrate surface of a substrate including the first substrate surface and a second substrate surface as a back surface of the first substrate surface, forming a thermally oxidized film by thermally oxidizing partition walls between the adjacent small holes and bottoms of the small holes, and removing the thermally oxidized film.

19 Claims, 6 Drawing Sheets

US 8,623,769 B2

THROUGH HOLE FORMING METHOD, NOZZLE PLATE AND MEMS DEVICE

BACKGROUND

1. Technical Field

The present invention relates to a method of forming a through hole in a substrate.

2. Related Art

A MEMS (Micro Electro Mechanical Systems) device is a device which has anew function and in which a micro structure and an electric circuit are combined and are miniaturized. Hitherto, in the MEMS device, a microfabrication technology developed mainly in a semiconductor device manufacturing technology is applied, and a structure of several µm to several hundred µm is formed on a silicon substrate or the like, so that a passive device such as a sensor and an active device such as an actuator are formed. Through holes for forming the structures of the MEMS devices are formed by etching or the like so as not to break the silicon substrate or the like.

JP-A-2007-168344 (patent document 1) discloses a through hole forming method including a step of forming a continuous nozzle hole (through hole), which has a small-hole end closed by a base member and a large-diameter hole base end opening on a surface of the base member and has a two-stage shape, by an etching process in the silicon base member, a step of bonding a support substrate to the large-diameter hole side surface of the silicon base member, and a step of thinning the small-diameter hole side surface of the silicon base member to open the end part of the small-diameter hole.

In a through hole forming method disclosed in JP-A-2010-240852 (patent document 2), dry etching is performed from one surface side of a silicon substrate to form a recess which becomes a first nozzle part (through hole), a protecting film having etching resistance is formed on the whole of the one surface of the silicon substrate including an inner wall of the recess, and a support substrate is bonded to the one surface. In that state, the silicon substrate is thinned from the other surface side so as to have a desired thickness, and a second nozzle part (through hole) communicating with the first nozzle part is formed by performing dry etching from the other surface side so as to open the bottom of the recess which becomes the first nozzle part. A first protecting film remaining on a portion corresponding to the bottom of the recess, which becomes the first nozzle part, is removed, and the support substrate is removed from the silicon substrate.

However, in the patent document 1, since the formation of the through hole is performed from the one side of the substrate, there is a problem that the shape of the terminal part of the etched hole becomes thin as compared with the etching start point. In the patent document 2, there is a problem that if a plurality of recesses which become through holes having different opening areas are formed simultaneously, the depths of the formed recesses vary according to the opening areas, and the depths of the recesses cannot be controlled. Besides, there is also a problem that if the through hole having a large opening area is formed, the protecting film formed on the recess is damaged when the second nozzle part, which becomes the through hole opposite to the recess, is formed, and gas for cooling the heat generated by the etching leaks.

Accordingly, a through hole forming method is required in which in a substrate on which a MEMS device or the like is formed, the shape of a hole which becomes a through hole is uniform from the start point of etching to the terminal end, gas used for the etching does not leak, and depths of recesses which become through holes having different areas can be controlled.

SUMMARY

An advantage of some aspects of the invention is to solve at least part of the problems described above, and can be realized by the following modes or application examples.

Application Example 1

This application example is directed to a through hole forming method including forming a first hole by forming a plurality of small holes to be continuously connected in a first substrate surface of a substrate including the first substrate surface and a second substrate surface opposite to the first substrate surface and by cutting and forming the small holes by etching, forming a thermally oxidized film on the substrate by thermally oxidizing the substrate as partition walls between the small holes and the substrate as bottoms of the small holes, and removing the thermally oxidized partition walls, the thermally oxidized bottoms and the thermally oxidized film formed on the substrate.

According to the through hole forming method, the plurality of small holes are formed to be continuously connected in the first substrate surface of the substrate including the first substrate surface and the second substrate surface and are cut and formed by the etching, so that the first hole having a desired opening area can be formed. Further, the substrate as the partition walls between the small holes, and the substrate as the bottoms of the small holes are thermally oxidized to form the thermally oxidized film on the substrate, and the formed thermally oxidized film is removed, so that the through hole passing through the first substrate surface and the second substrate surface can be formed.

Application Example 2

It is preferable in the through hole forming method that the first hole is formed by continuously connecting the small holes having polygonal shapes.

According to this configuration, the shapes of the small holes constituting the first hole are polygonal, and the small holes are formed to be continuously connected, so that the small holes can be formed closely. Thus, the thickness of the substrate as the partition walls of the small holes becomes uniform, and the partition walls can be uniformly thermally oxidized. Besides, the strength of the bottom is increased, and the damage of the bottom can be suppressed.

Application Example 3

It is preferable that the through hole forming method includes forming a second hole opposite to the first hole in the second substrate surface.

According to this configuration, since the second hole opposite to the first hole is formed, the through hole in which opening areas of the first hole and the second hole are different from each other can be formed. Besides, the accuracy of the etching depth of the small holes to be formed can be loosened.

Application Example 4

It is preferable in the through hole forming method that a plurality of the first holes are formed in which the numbers of the small holes formed to be continuously connected are different from each other.

According to this configuration, the first holes are formed in which the numbers of the small holes constituting the first holes are different from each other, so that the plurality of the first holes having different opening areas can be formed. Accordingly, the plurality of the first holes different in opening area can be simultaneously formed.

Application Example 5

It is preferable in the through hole forming method that a plurality of the first holes are formed in which opening areas of the small holes formed to be continuously connected are different from each other.

According to this configuration, the opening areas of the small holes constituting the first holes are different from each other, so that the cutting formation speed of the etching varies according to the difference in the opening areas of the small holes. Thus, the first holes can be formed to have different depths. Accordingly, the plurality of the first holes different in depth can be simultaneously formed.

Application Example 6

It is preferable in the through hole forming method that a plurality of the first holes different in opening areas and depths of the first holes are simultaneously formed.

According to this configuration, the numbers of the small holes constituting the first holes and formed to be continuously connected and the opening areas of the small holes are made different from each other, so that the plurality of the first holes different in the depths and the opening areas of the first holes can be simultaneously formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
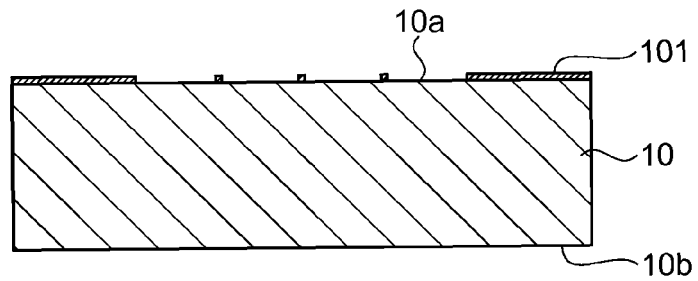
FIGS. 1A to 1D are schematic views showing a process of forming a through hole in a substrate according to a first embodiment.

Hereinafter, methods of forming a through hole 3 in a substrate 10 according to embodiments will be described with reference to the drawings. Incidentally, in the respective drawings shown below, in order to cause respective components to have such sizes that they can be recognized on the drawings, the sizes and ratios of the respective components are appropriately made different from those of the actual components.

First Embodiment

A through hole forming method of this embodiment will be described with reference to FIGS. 1A to 1D and FIG. 2. FIGS. 1A to 1D are schematic sectional views showing a process of forming a through hole 3 in a substrate 10 including a first substrate surface 10a and a second substrate surface 10b opposite to the first substrate surface 10a. FIG. 2 is a top view showing the substrate 10 in which the through hole 3 is formed. Incidentally, FIGS. 1A to 1D show a section taken along A-A' shown in FIG. 2.

In the through hole forming method, a plurality of small holes 11, which become a first hole 1, are formed in the first substrate surface 10a of the substrate 10 including the first substrate surface 10a and the second substrate surface 10b opposite to the first substrate surface 10a. Next, partition walls 12 and bottoms 13 of the small holes 11 formed in the first substrate surface 10a are thermally oxidized, so that an oxide film 201 is formed on the substrate 10. Next, the thermally oxidized partition walls 12 and the thermally oxidized bottoms 13, and the oxide film 201 formed on the substrate 10 are removed, so that the through hole 3 passing through the first substrate surface 10a and the second substrate surface 10b is formed. Incidentally, in this embodiment, a silicon substrate is used as the substrate 10.

The process of performing the through hole forming method includes a first photo process of transferring shapes of the small holes 11 constituting the first hole 1, which becomes the through hole 3, onto the first substrate surface 10a, and a first hole forming process of cutting and forming the shapes of the small holes 11 transferred onto the first substrate surface 10a by dry etching. Besides, there are provided a thermally oxidized film forming process of forming the oxide film 201 on the substrate 10 by thermally oxidizing the partition walls 12 and the bottoms 13 of the small holes 11 formed in the first hole forming process, and a removing process of removing the thermally oxidized partition walls 12 and the bottoms 13 of the small holes 11 and the oxide film 201 formed on the substrate 10.

Hereinafter, the through hole forming method of this embodiment will be described in detail.

Figure 2:
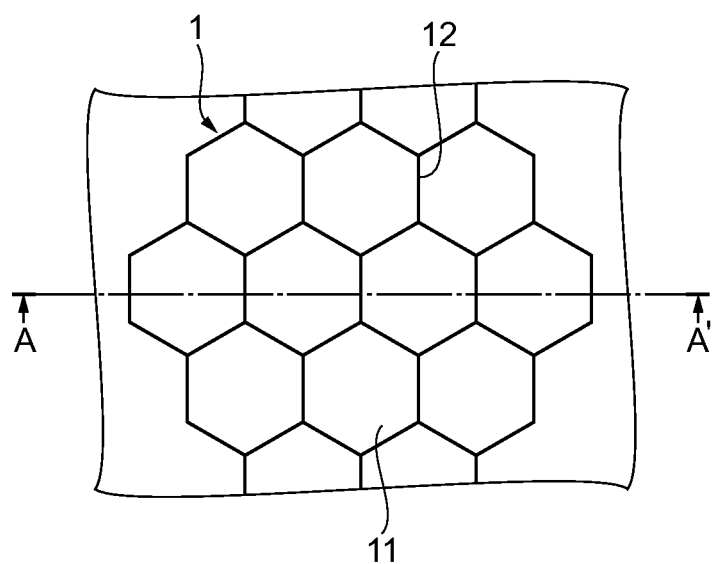
FIG. 2 is a schematic view showing an upper surface of the substrate in which the through hole is formed.

FIG. 1A is a schematic view showing the first photo process of transferring the shapes of the small holes 11 constituting the first hole 1 onto the first substrate surface 10a. As shown in FIG. 1A, in the first photo process, a photosensitive material (hereinafter referred to as "resist") is applied to the first substrate surface 10a and a first resist film 101 is formed. Next, a mask plate (not shown) on which the shapes of the small holes 11 are drawn is arranged to face the first substrate surface 10a on which the first resist film 101 is formed. Next, the shapes of the small holes 11 drawn on the mask plate are transferred onto the first resist film 101 formed on the first substrate surface 10a by exposure. Next, the first resist film 101 onto which the shapes of the small holes 11 are transferred by the exposure is developed, so that the first resist film 101 having the shapes of the small holes 11 is peeled, and the first substrate surface 10a is exposed.

FIG. 2 is a schematic top view showing the small holes 11 formed on the first substrate surface 10a in the first photo process. As shown in FIG. 2, the first hole 1 is formed by continuously connecting the polygonal small holes 11, and the first hole 1 is constructed. Incidentally, although the small hole 11 of this embodiment is hexagonal, no limitation is made to the hexagonal shape and any polygonal shape may be used.

Figure 1B:
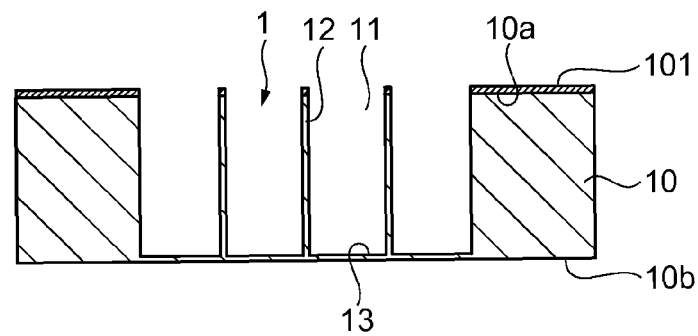

FIG. 1B is a schematic view showing the first hole forming process of forming the first hole 1 by cutting and forming the shapes of the small holes 11, which were transferred onto the first substrate surface 10a in the first photo process and were formed by peeling the first resist film 101, by dry etching. As shown in FIG. 1B, in the first hole forming process, the shapes of the small holes 11 transferred in the first photo process are cut and formed by the dry etching, and the small holes 11 are formed. The depth of the small hole 11 formed in the first hole forming process is determined by cutting and forming the small hole 11 until the thickness of the bottom 13 becomes substantially equal to the thickness of the partition wall 12.

Figure 1C:
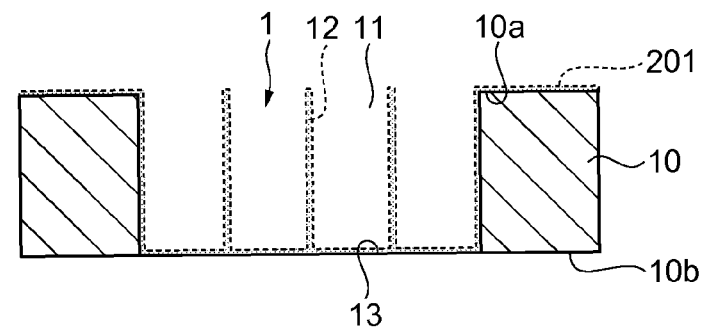

FIG. 1C is a schematic view showing the thermally oxidized film forming process of forming the oxide film 201 on the substrate 10 by thermally oxidizing the partition walls 12 and the bottoms 13 of the small holes 11 formed in the first hole forming process. As shown in FIG. 1C, in the thermally oxidized film forming process, the substrate 10 in which the small holes 11 are formed is heated by a thermally oxidizing apparatus (not shown), and is reacted with oxygen or water vapor, so that the oxide film 201 is formed on the surface of the substrate 10 and the small holes 11.

In the formation of the oxide film 201 by thermal oxidation, silicon as a component of the substrate 10 and oxygen filled in the thermally oxidizing apparatus or oxygen contained in water vapor react with each other so that the oxide film 201 is formed. When the oxide film 201 is formed in the thermally oxidized film forming process, silicon as the component of the substrate 10 is oxidized so that the oxide film 201 is formed. With respect to the silicon of the oxidized substrate 10, when the molecular weight of silicon is 28.09 g/mol, and the density thereof is 2.33 g/cm$^3$, and the molecular weight of the formed oxide film 201 is 60.08 g/mol, and the density thereof is 2.21 g/cm$^3$, if the oxide film with thickness x is formed, silicon with thickness of 0.44x is oxidized.

The thickness of the oxide film 201 formed in the thermally oxidized film forming process is such that the partition walls 12 and the bottoms 13 of the small holes 11 are thermally oxidized, and all the silicon constituting the portion is oxidized. For example, when the thickness of the partition wall 12 is 1 μm, in order to oxidize all the partition walls 12 under the foregoing condition, the oxide film 201 with a thickness of 1.2 μm or more is formed, and the silicon constituting the partition walls 12 is oxidized.

Figure 1D:
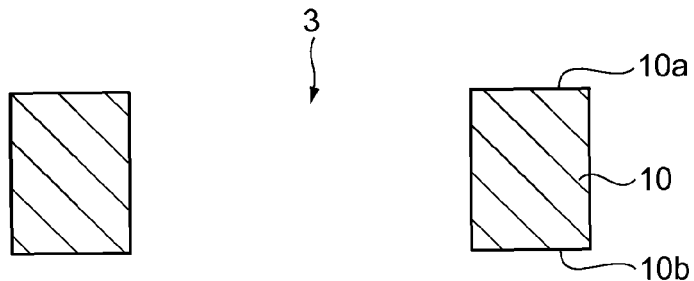

FIG. 1D is a schematic view showing the removing process of removing the oxide film 201 formed in the thermally oxidized film forming process. As shown in FIG. 1D, in the removing process, the substrate 10 is immersed in a solution containing hydrofluoric acid or the like, and the thermally oxidized silicon and the solution react with each other, so that the oxide film 201 and the thermally oxidized partition walls 12 and the bottoms 13 are removed. When the removing process is completed, the through hole 3 passing through the first substrate surface 10a and the second substrate surface 10b is formed and the series of processes are completed.

According to the first embodiment, the following effects can be obtained.

In the through hole forming method of the embodiment, the plurality of small holes 11, which become the first hole 1, are formed to be continuously connected by the dry etching in the first substrate surface 10a, so that the damage of the substrate 10 is suppressed, and the first hole 1 with a desired opening area can be formed. Accordingly, irrespective of the opening area of the first hole 1, the first hole 1 can be formed by the dry etching of the first hole forming process without damaging the substrate 10.

In the through hole forming method of the embodiment, the partition walls 12 and the bottoms 13 of the small holes 11 constituting the first hole 1 are thermally oxidized, and the oxide film 201 is formed on the substrate 10, so that the partition walls 12 and the bottoms 13 can be removed in the removing process. Accordingly, the through hole 3 passing through the first substrate surface 10a and the second substrate surface 10b can be formed without piercing through the substrate 10 by the dry etching.

In the through hole forming method of the embodiment, the shapes of the small holes 11 constituting the first hole 1 are polygonal, and the small holes 11 are formed to be continuously connected, so that the small holes 11 can be closely formed. Thus, the thickness of the substrate 10, which becomes the partition wall 12 of the small hole 11, becomes uniform, and the partition walls 12 can be uniformly thermally oxidized. Accordingly, all the partition walls 12 can be removed in the removing process.

In the through hole forming method of the embodiment, since the first hole 1, which becomes the through hole 3, is formed without piercing through the substrate by the dry etching, dry etching reactive gas can be prevented from flowing out to the second substrate surface 10b opposite to the first substrate surface 10a in which the first hole 1 is formed. Besides, cooling gas, which protects the substrate 10 from heat generated by the dry etching, can be prevented from flowing into the first hole 1 under formation. Accordingly, even if the flowing-out of the dry etching reactive gas and the flowing-in of the cooling gas are not suppressed by bonding another substrate to the substrate 10 in which the through hole 3 is formed, the flowing-out of the dry etching reactive gas and the flowing-in of the cooling gas can be suppressed.

Second Embodiment

A through hole forming method of this embodiment is different from the through hole forming method of the first embodiment in that a second hole 2 opposite to a first hole 1 is formed in a second substrate surface 10b. Since the through hole forming method and through hole forming processes other than that are the same as those of the first embodiment, the same method and components are denoted by the same reference numerals and the description thereof is omitted or simplified.

The through hole forming method of this embodiment will be described with reference to FIGS. 3A to 3D and FIGS. 4E and 4F. FIGS. 3A to 3D and FIGS. 4E and 4F are schematic sectional views showing a process of forming, in a substrate 10 similar to the first embodiment, the first hole 1, which becomes a through hole 3, in a first substrate surface 10a and a process of forming the second hole 2 in the second substrate surface 10b.

In the through hole forming method, a plurality of small holes 11, which become the first hole 1, are formed to be continuously connected in the first substrate surface 10a of the substrate 10. Next, partition walls 12 and bottoms 13 of the small holes 11 formed in the first substrate surface 10a are thermally oxidized, and an oxide film 201 is formed on the substrate 10. Next, the second hole 2, which is opposite to the first hole 1 and reaches the bottom 13 of the first hole 1, is formed in the second substrate surface 10b. Next, the thermally oxidized partition walls 12 and the bottoms 13, and the oxide film 201 formed on the substrate 10 are removed, so that the first hole 1 formed in the first substrate surface 10a and the second hole 2 formed in the second substrate surface 10b communicate with each other, and the through hole 3 is formed. Incidentally, in this embodiment, a silicon substrate is used as the substrate 10.

The process of carrying out the through hole forming method includes a first photo process of transferring shapes of the small holes 11 constituting the first hole 1, which becomes the through hole 3, onto the first substrate surface 10a, and a first hole forming process of forming the shapes of the small holes 11 transferred onto the first substrate surface 10a by dry etching. Besides, a thermally oxidized film forming process is provided in which the partition walls 12 and the bottoms 13 of the small holes 11 formed in the first hole forming process are thermally oxidized, and the oxide film 201 is formed on the substrate 10. Further, there are provided a second photo process of transferring a shape of the second hole 2, which becomes the through hole 3, onto the second substrate surface 10b so as to be opposite to the first hole 1, a second hole forming process of cutting and forming the shape of the second hole 2 transferred onto the second substrate surface 10b by dry etching, and a removing process of removing the thermally oxidized partition walls 12 and the bottoms 13 of the small holes 11, and the oxide film 201 formed on the substrate 10.

Hereinafter, the through hole forming method of this embodiment will be described in detail.

Figure 3A:
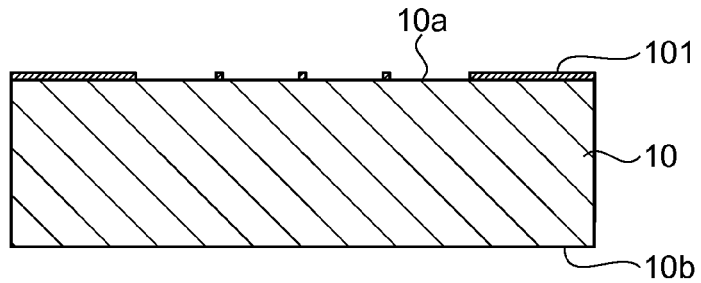
FIGS. 3A to 3D are schematic views showing a process of forming a through hole in a substrate according to a second embodiment.

FIG. 3A is a schematic view showing the first photo process of transferring the shapes of the small holes 11 constituting the first hole 1 onto the first substrate surface 10a. As shown in FIG. 3A, similarly to the first embodiment, in the first photo process, the shapes of the small holes 11 are transferred onto the first substrate surface 10a to which a first resist film 101 is applied, and development is performed, so that the first resist film 101 having the shapes of the small holes 11 is peeled, and the first substrate surface 10a is exposed.

Figure 3B:
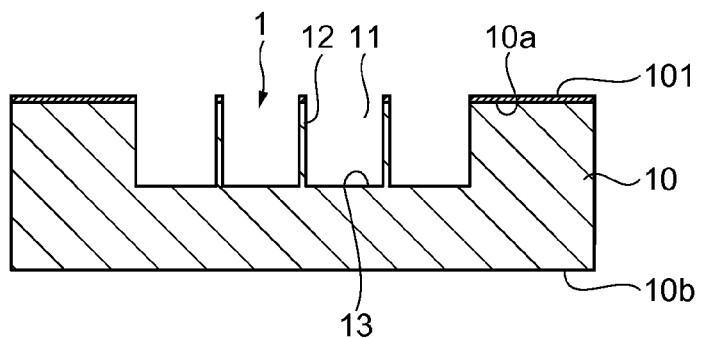

FIG. 3B is a schematic view showing the first hole forming process of forming the first hole 1 by cutting and forming the shapes of the small holes 11, which were transferred onto the first substrate surface 10a in the first photo process and were formed by peeling the first resist film 101, by dry etching. Similarly to the first embodiment, in the first hole forming process shown in FIG. 3B, the small holes 11, which become the first hole 1, are formed by the dry etching. The depth of the formed first hole 1 is made the depth obtained by subtracting the depth of the after-mentioned second hole 2 and the thickness of the partition wall 12 of the small hole 11 from the thickness of the substrate 10.

Figure 3C:
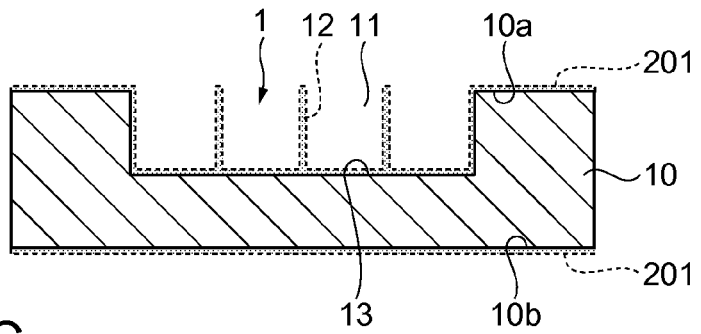

FIG. 3C is a schematic view showing the thermally oxidized film forming process of forming the oxide film 201 on the substrate 10 by thermally oxidizing the partition walls 12 and the bottoms 13 of the small holes 11 formed in the first hole forming process. In the thermally oxidized film forming process shown in FIG. 3C, similarly to the first embodiment, the partition walls 12 and the bottoms 13 of the small holes 11 are thermally oxidized, and the oxide film 201 is formed on the substrate 10. Similarly to the first embodiment, the thickness of the formed oxide film 201 is such that all the silicon of the substrate 10 constituting the partition walls 12 and the bottoms 13 of the small holes 11 is thermally oxidized.

Figure 3D:
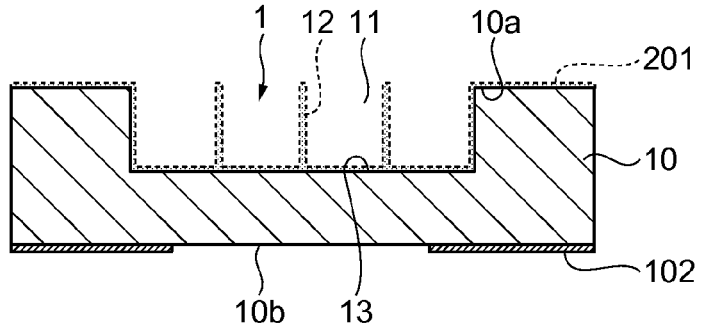

FIG. 3D is a schematic view showing the second photo process of transferring the shape of the second hole 2, which becomes the through hole 3, onto the second substrate surface 10b opposite to the first substrate surface 10a. Similarly to the first photo process, in the second photo process, the shape of the second hole 2 is transferred onto a second resist film 102 formed on the second substrate surface 10b and development is performed, so that the second substrate surface 10b having the shape of the second hole 2 is exposed.

Figure 4E:
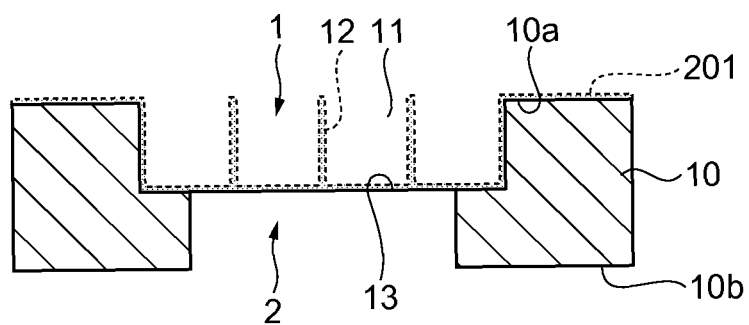
FIGS. 4E and 4F are schematic views showing the process of forming the through hole in the substrate according to the second embodiment.

FIG. 4E is a schematic view showing the second hole forming process of forming the second hole 2 by cutting and forming the shape of the second hole 2, which was transferred onto the second substrate surface 10b in the second photo process and was formed by peeling the second resist film 102, by dry etching. As shown in FIG. 4E, in the second hole forming process, the shape of the second hole 2 transferred in the second photo process is cut and formed by the dry etching, and the second hole 2 is formed.

In the dry etching of the second hole forming process, the dry etching reaction is suppressed by the thermally oxidized bottom 13 of the first hole 1 opposite to the second hole 2. Thus, the depth of the second hole 2 formed by the etching is from the second substrate surface 10b to the thermally oxidized bottom 13 of the small hole 11, in other words, the depth obtained by subtracting the depth of the first hole 1 and the thickness of the thermally oxidized bottom 13 from the thickness of the substrate 10.

Figure 4F:
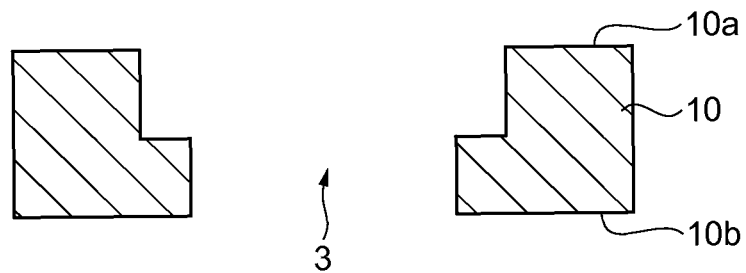

FIG. 4F is a schematic view showing the removing process of removing the oxide film 201 formed in the thermally oxidized film forming process. As shown in FIG. 4F, similarly to the first embodiment, in the removing process, the substrate 10 is immersed in a solution containing hydrofluoric acid or the like, and the oxide film 201 formed in the thermally oxidized film forming process and the thermally oxidized partition walls 12 and the bottoms 13 are removed. By performing the removal, the first hole 1 formed in the first substrate surface 10a and the second hole 2 formed in the opposite second substrate surface 10b communicate with each other, so that the through hole 3 is formed, and the series of processes are completed.

According to the second embodiment, the following effects are obtained.

In the through hole forming method of the embodiment, the second hole 2 opposite to the first hole 1 is formed, so that the through hole 3 can be formed in which the opening area of the first hole 1 is different from that of the second hole 2. The cutting depths of the first hole 1 and the second hole 2, which become the through hole 3, from the first substrate surface 10a and the second substrate surface 10b become shallow as compared with a case where the through hole 3 is formed by dry etching from one of the substrate surfaces of the substrate 10. Accordingly, the shapes of the terminal ends of the first hole 1 and the second hole 2 do not become thin as compared with that of the dry etching start point, and the through hole 3 having uniform hole diameter can be realized.

In the through hole forming method of the embodiment, the shapes of the small holes 11 constituting the first hole 1 are made polygonal, so that the strength of the bottom 13 can be enhanced. By this, even when the through hole 3 having a large opening of, for example, several hundred μm or more is formed, the bottom 13 can be prevented from being pierced by the dry etching reaction for forming the second hole 2. Accordingly, the through hole 3 having a large opening area can be formed with high accuracy by the dry etching without leaking the gas for refrigerating heat generation in the dry etching.

In the through hole forming method of the embodiment, the second hole 2 opposite to the first hole 1 is formed, so that the depth accuracy of the small hole 11 formed by the dry etching in the first hole forming process can be relieved as compared with the first hole forming process of the first embodiment in which the small hole 11 is cut and formed by the dry etching until the thickness of the bottom becomes equal to the thickness of the partition wall 12.

Third Embodiment

In this embodiment, a method of forming a nozzle plate 20 for discharging a droplet, which is one of MEMS devices, by using a through hole forming method according to the invention will be described. The same method and components as those described in the first embodiment and the second embodiment are denoted by the same reference numerals and the description thereof is omitted or simplified.

FIGS. 5A to 5D and FIGS. 6E and 6F are schematic sectional views showing a process in which a through hole 3f which becomes a nozzle hole 31 for discharging a droplet and a through hole 3e which becomes a fixing hole 32 for fixing the nozzle plate 20 to another device are formed in a substrate 10 similar to that of the foregoing embodiment, which becomes the nozzle plate 20.

The method of forming the nozzle plate 20 by using the through hole forming method of the foregoing embodiment will be described with reference to FIGS. 5A to 5D and FIGS. 6E and 6F. As shown in FIG. 6F, the nozzle plate 20 formed in this embodiment includes the through hole 3f which becomes the nozzle hole 31 for discharging a droplet, and the through hole 3e which becomes the fixing hole 32 used for fixing the nozzle plate 20 to another device. The nozzle plate 20 of this embodiment is an example which is formed by using the through hole forming method according to the invention, and the structure of the nozzle plate 20 formed using the invention is not limited.

Similarly to the second embodiment, in the through hole forming method of forming the nozzle plate 20, a plurality of small holes 11 constituting a first hole 1e which becomes the through hole 3e are formed to be continuously connected in a first substrate surface 10a of the substrate 10. Besides, a first hole 1f which becomes the through hole 3f having an opening area smaller than the through hole 3e is formed. Next, partition walls 12 between the small holes 11 formed in the first substrate surface 10a, bottoms 13 of the small holes 11, and a bottom 13 of the first hole 1f are thermally oxidized to form an oxide film 201 on the substrate 10. Next, the substrate 10 forming the nozzle plate 20 is ground to have a specified thickness, and is made a thin plate. Next, second holes 2e and 2f opposite to the first holes 1e and 1f are formed in a second substrate surface 10b.

Next, the partition walls 12 and the bottoms 13 of the small holes 11 constituting the first hole 1e, the bottom 13 of the first hole 1f, and the oxide film 201 formed on the substrate 10 are removed, so that the first holes 1e and 1f formed in the first substrate surface 10a communicate with the second holes 2e and 2f formed in the second substrate surface 10b, and the through hole 3e which becomes the fixing hole 32 and the through hole 3f which becomes the nozzle hole 31 are formed. Incidentally, in this embodiment, a silicon substrate is used as the substrate 10.

The process of the through hole forming method for forming the nozzle plate 20 includes a first photo process of transferring shapes of the small holes 11 constituting the first hole 1e which becomes the through hole 3e and a shape of the first hole 1f which becomes the through hole 3f, and a first hole forming process of cutting and forming the shapes of the small holes 11 and the shape of the first hole 1f, which were formed in the first substrate surface 10a, by dry etching. Besides, there are provided a thermally oxidized film forming process of forming the oxide film 201 on the substrate 10 by thermally oxidizing the partition walls 12 and the bottoms 13 of the small holes 11 and the bottom 13 of the first hole 1f, which were formed in the first hole forming process, and a plate thinning process of forming a thin plate by grinding the substrate 10 to have the specified thickness of the nozzle plate 20 to be formed. Further, there are provided a second photo process of transferring a shape of the second hole 2e which becomes the through hole 3e, and a shape of the second hole 2f which becomes the through hole 3f, a second hole forming process of cutting and forming the shapes of the second holes 2e and 2f, which were transferred in the second photo process, by dry etching, and a removing process of removing the partition walls 12 and the bottoms 13 of the small holes 11, the bottom 13 of the first hole 1f, and the oxide film 201 formed on the substrate 10.

Hereinafter, the through hole forming method for forming the nozzle plate 20 of the embodiment will be described in detail.

Figure 5A:
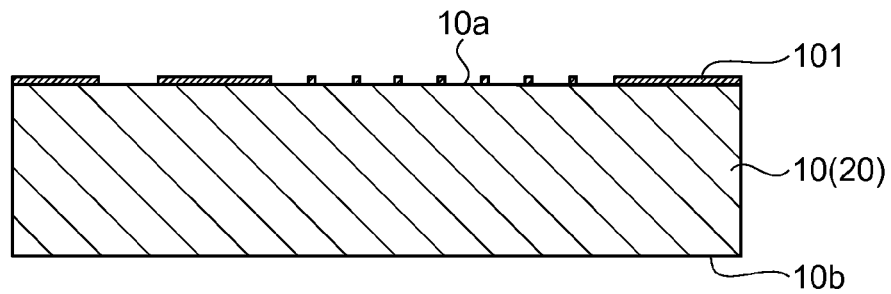
FIGS. 5A and 5D are schematic views showing a process of simultaneously forming through holes different in opening area and depth in a substrate according to a third embodiment.

FIG. 5A is a schematic view showing the first photo process of transferring the shapes of the first holes 11 constituting the first hole 1e and the shape of the first hole 1f. As shown in FIG. 5A, similarly to the second embodiment, in the first photo process, the shapes of the small holes 11 and the shape of the first hole 1f are transferred onto the first substrate surface 10a to which a first resist film 101 is applied, and development is performed, so that the first resist film 101 having the shapes of the small holes 11 and the shape of the first hole 1f is peeled, and the first substrate surface 10a is exposed.

The opening areas of the first hole 1f and the small hole 11 influence the depths of the first hole 1f and the small hole 11 which are cut and formed by using dry etching in the aftermentioned first hole forming process. As the opening area becomes large, the cutting depth per unit time by the etching becomes deep. In this embodiment, the opening area and the depth of the first hole 1f which becomes the hole of the nozzle hole 31 for discharging a droplet is made reference, and the first hole 1f and the first hole 1e different in depth and opening area are simultaneously formed in the first substrate surface 10a.

In this embodiment, since the first hole 1e is formed to be shallower than the first hole 1f, the small holes 11 constituting the first hole 1e are formed to have smaller opening areas than the first hole 1f. Thus, the cutting formation speed of the first hole 1e is reduced as compared with the cutting formation of the first hole 1f. That is, if the etching is performed for the same time, the first hole 1e is formed to be shallower.

Figure 5B:
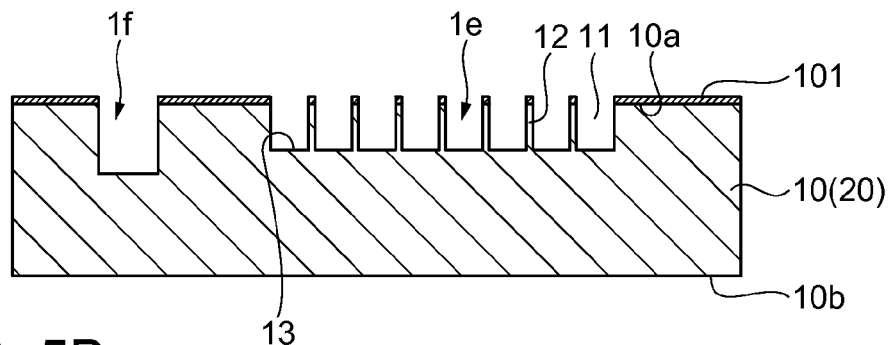

FIG. 5B is a schematic view showing the first hole forming process of forming the first holes 1e and 1f by cutting and forming the shapes of the small holes 11 and the first hole 1f, which were transferred onto the first substrate surface 10a and were obtained by peeling the first resist film 101 in the first photo process, by dry etching. In the first hole forming process shown in FIG. 5B, similarly to the foregoing embodiment, the small holes 11 which become the first hole 1e and the first hole 1f are formed by the dry etching.

Figure 5C:
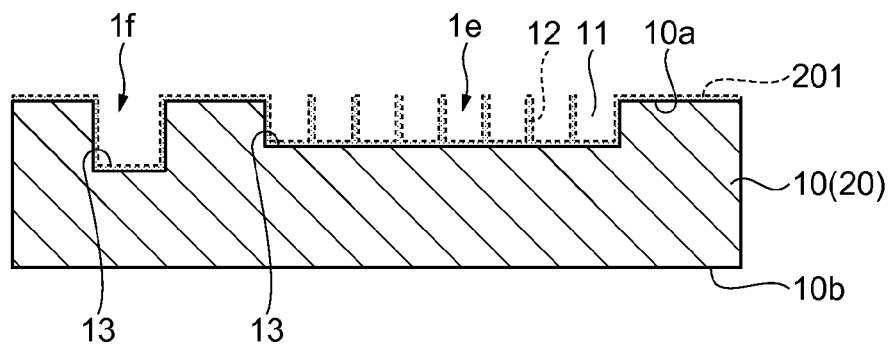

FIG. 5C is a schematic view showing the thermally oxidized film forming process of forming the oxide film 201 on the substrate 10 by thermally oxidizing the bottom 13 of the first hole 1f, and the partition walls 12 and the bottoms 13 of the small holes 11 constituting the first hole 1e, which were formed in the first hole forming process. Similarly to the second embodiment, in the thermally oxidized film forming process shown in FIG. 5C, the film thickness of the formed oxide film 201 is made such that the partition walls 12 and the bottoms 13 of the small holes 11 are thermally oxidized, and all the silicon of the substrate 10 constituting the partition walls 12 is oxidized.

Figure 5D:
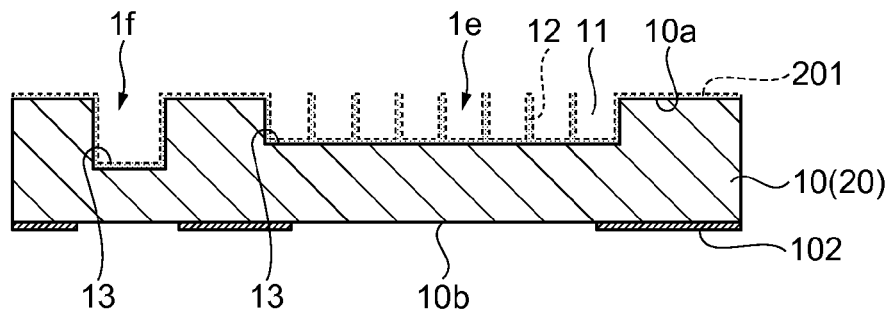

FIG. 5D is a schematic view showing the second photo process of transferring the shapes of the second holes 2e and 2f, which become the through holes 3e and 3f, onto the second substrate surface 10b opposite to the first substrate surface 10a. Similarly to the first photo process, in the second photo process, the shapes of the second holes 2e and 2f are transferred to the second substrate surface 10b by exposure onto a second resist film 102 formed on the second substrate surface 10b and development is performed, so that the second substrate surface 10b having the shapes of the second holes 2e and 2f is exposed.

Figure 6E:
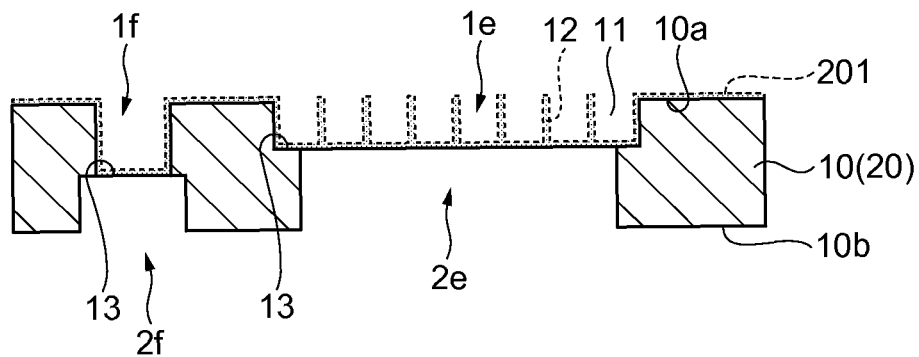
FIGS. 6E and 6F are schematic views showing the process of simultaneously forming the through holes different in opening area and depth in the substrate according to the third embodiment.
Figure 6F:
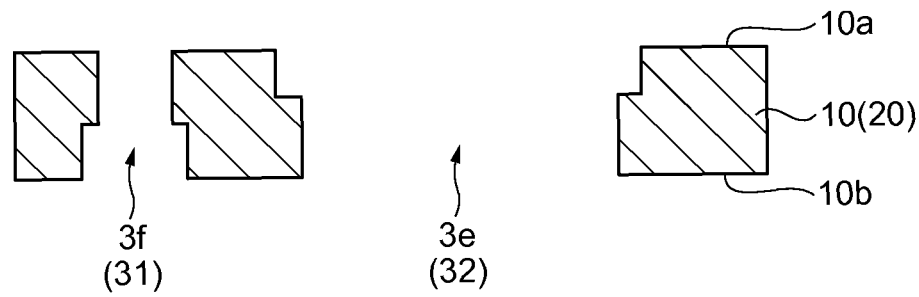

FIG. 6E is a schematic view showing the second hole forming process of forming the second hole 2e, 2f by cutting and forming the shapes of the second holes 2e and 2f, which were transferred onto the second substrate surface 10b and were formed by peeling the second resist film 102 in the second photo process, by dry etching. As shown in FIG. 6E, in the second hole forming process, the shapes of the second holes 2e and 2f transferred in the second photo process are cut by the dry etching, and the second holes 2e and 2f are formed.

In the dry etching of the second hole forming process, the etching reaction is suppressed by the thermally oxidized bottoms 13 of the first holes 1e and 1f. Thus, similarly to the foregoing embodiment, the depths of the second holes 2e and 2f cut and formed by the dry etching are depths from the second substrate surface 10b to the thermally oxidized bottoms 13 of the first hole 1f and the small hole 11, in other words, depths obtained by subtracting the depths of the first holes 1e and 1f and the thicknesses of the thermally oxidized bottom 13 from the thickness of the substrate 10.

FIG. 6F is a schematic view showing the removing process of removing the partition walls 12 and the bottoms 13 thermally oxidized in the thermally oxidized film forming process and the oxide film 201 formed on the substrate 10. As shown in FIG. 6F, in the removing process, similarly to the foregoing embodiment, the partition walls 12 and the bottoms 13 thermally oxidized in the thermally oxidized film forming process and the formed oxide film 201 are removed by immersing the substrate 10 in a solution containing hydrofluoric acid or the like. The oxide film 201, the thermally oxidized partition walls 12 and the bottoms 13 of the small holes 11, and the bottom 13 of the first hole 1f are removed, so that the first holes 1e and 1f formed in the first substrate surface 10a communicate with the second holes 2e and 2f formed in the second substrate surface 10b, the through hole 3e which becomes the fixing hole 32 of the nozzle plate 20 and the hole 3f which becomes the nozzle hole 31 are formed, and the series of processes are completed.

According to the third embodiment, the following effects are obtained.

In the through hole forming method of the embodiment, the opening area and the depth of the first hole 1f constituting the through hole 3f is made the reference, and the depth of the first hole 1e constituting the through hole 3e cut and formed by the etching can be controlled. By this, the plurality of through holes 3 having the first holes 1 different in opening area and depth can be simultaneously formed.

In the through hole forming method of the embodiment, the first holes 1 different in opening area and depth are simultaneously formed, so that the number of times of the dry etching can be reduced. By this, when another hole or the like is formed by the dry etching in the substrate 10, the already formed hole or the like can be prevented from being damaged. Besides, since the number of times of the dry etching is reduced, the efficiency of the dry etching can be raised.

The entire disclosure of Japanese Patent Application No. 2011-044778, filed Mar. 2, 2011 is expressly incorporated by reference herein.

What is claimed is:

1. A through hole forming method comprising:
    forming a first hole by forming a plurality of small holes to be continuously connected in a first substrate surface of a substrate including the first substrate surface and a second substrate surface opposite to the first substrate surface and by cutting and forming the small holes by etching;
    forming a thermally oxidized film on the substrate by thermally oxidizing the substrate as partition walls between the small holes and the substrate as bottoms of the small holes; and
    removing the thermally oxidized partition walls, the thermally oxidized bottoms and the thermally oxidized film formed on the substrate.

2. The through hole forming method according to claim 1, wherein the first hole is formed by continuously connecting the small holes having polygonal shapes.

3. The through hole forming method according to claim 1, further comprising forming a second hole opposite to the first hole in the second substrate surface.

4. The through hole forming method according to claim 1, wherein a plurality of the first holes are formed in which the numbers of the small holes formed to be continuously connected are different from each other.

5. The through hole forming method according to claim 1, wherein a plurality of the first holes are formed in which opening areas of the small holes formed to be continuously connected are different from each other.

6. The through hole forming method according to claim 1, wherein a plurality of the first holes different in opening areas and depths of the first holes are simultaneously formed.

7. A through hole forming method comprising:
    forming a plurality of small holes in a first substrate surface of a substrate including the first substrate surface and a second substrate surface as a back surface of the first substrate surface;
    forming a thermally oxidized film by thermally oxidizing partition walls between the adjacent small holes and bottoms of the small holes; and
    forming a first hole by removing the thermally oxidized film formed on the partition walls and the bottoms.

8. The through hole forming method according to claim 7, wherein the small holes include the small holes that are polygonal when the substrate is viewed in plane.

9. The through hole forming method according to claim 8, wherein the small holes include the small holes that are hexagonal when the substrate is viewed in plane.

10. The through hole forming method according to claim 7, further comprising forming a second hole in the second substrate surface.

11. The through hole forming method according to claim 7, wherein a plurality of the first holes are formed in which the numbers of the small holes are different from each other.

12. The through hole forming method according to claim 7, wherein a plurality of the first holes are formed in which opening areas of the small holes are different from each other.

13. The through hole forming method according to claim 7, wherein a plurality of the first holes different in opening area and depth are simultaneously formed.

14. A nozzle plate formed by a through hole forming method according to claim 7.

15. A nozzle plate formed by a through hole forming method according to claim 8.

16. A nozzle plate formed by a through hole forming method according to claim 9.

17. A MEMS device formed by a through hole forming method according to claim 7.

18. A MEMS device formed by a through hole forming method according to claim 8.

19. A MEMS device formed by a through hole forming method according to claim 9.

* * * * *